(12) United States Patent  
Lee

(10) Patent No.: US 7,612,770 B2  
(45) Date of Patent: Nov. 3, 2009

(54) SYSTEMS FOR DISPLAYING IMAGES

(75) Inventor: Ching-Hone Lee, Hsinchu (TW)

(73) Assignee: TPO Displays Corp., Miao-Li County (TW)

(*) Notice: Subject to any disclaimer, the term of this patent is extended or adjusted under 35 U.S.C. 154(b) by 557 days.

(21) Appl. No.: 11/456,364

(22) Filed: Jul. 10, 2006

(65) Prior Publication Data

US 2007/0139348 A1 Jun. 21, 2007

Related U.S. Application Data

(60) Provisional application No. 60/750,766, filed on Dec. 15, 2005.

(51) Int. Cl.
  G09G 5/00 (2006.01)
  G09G 3/28 (2006.01)
  G11C 19/00 (2006.01)
  G06F 3/038 (2006.01)

(52) U.S. Cl. .................... 345/204; 345/61; 377/64

(58) Field of Classification Search ........... 345/30–111, 345/204–215; 377/64–81
See application file for complete search history.

(56) References Cited

U.S. PATENT DOCUMENTS 6,339,631 B1 1/2002 Yeo et al.
2005/0185752 A1 8/2005 Sasaki et al.

OTHER PUBLICATIONS

EP Search Report issued Feb. 4, 2009.

*Primary Examiner*—Srilakshmi K Kumar
(74) *Attorney, Agent, or Firm*—Thomas, Kayden, Horstemeyer & Risley

(57) ABSTRACT

Systems for displaying images are provided. A representative system comprises a signal driving circuit comprising a plurality of shift registers connected in series and controlled only by a first clock and a second clock, generating corresponding driving pulses in turn in response to a start pulse. Each shift register comprises a pulse generation unit with a first clock input terminal receiving one of the first and the second clocks and a first power terminal coupled to a first power voltage, and a leakage protection unit coupled to the pulse generation unit, electrically separating the first power voltage from the received clock at the first clock input terminal.

19 Claims, 8 Drawing Sheets

SYSTEMS FOR DISPLAYING IMAGES

CROSS REFERENCE TO RELATED APPLICATIONS

This application claims the benefit of U.S. Provisional Application No. 60/750,766, filed Dec. 15, 2005.

BACKGROUND OF THE INVENTION

1. Field of the Invention

The invention relates to the display of images.

2. Description of the Related Art

High definition, multicolor display, low power consumption, lower voltage requirements and light weight have made liquid crystal display (LCD) a leading display device technology. LCDs have been used for several years for mobile information display in, for example, personal digital assistants (PDAs), portable computers, mobile phones and the like.

FIG. 1 shows a conventional signal driving circuit comprising PMOS shift registers. The PMOS shift register shown, however, requires four clock signals CLK1~CLK4 provided by an external application specific integrated circuit (ASIC) (not shown). Because of the increased clock signals, ASICs requiring the use of PMOS shift registers are typically more expensive.

BRIEF SUMMARY OF THE INVENTION

Embodiments of a system for displaying images are provided, comprising a signal driving circuit. The signal driving circuit comprises a plurality of shift registers connected in series and controlled only by a first clock and a second clock, generating corresponding driving pulses in turn in response to a start pulse. Each shift register comprises a pulse generation unit with a first clock input terminal receiving one of the first and the second clocks and a first power terminal coupled to a first power voltage, and a leakage protection unit coupled to the pulse generation unit, electrically separating the first power voltage from the received clock at first clock input terminal.

Another embodiment of a system for displaying images comprises a signal driving circuit with a plurality of shift registers connected in series to generate corresponding driving pulses in turn in response to a start pulse. Each shift register comprises a pulse generation unit powered by a first power voltage and a second power voltage and coupled to a first clock and a second clock, and a leakage protection unit coupled to the pulse generation unit, electrically separating the first and second power voltages from the first and second clocks.

Another embodiment of a system for displaying images comprises a signal driving circuit controlled by a first clock and a second clock to generate corresponding driving pulses in turn in response to a start pulse. In the signal driving circuit, a first shift register comprises a first clock input terminal receiving the first clock, a second clock input terminal receiving the second clock, a power terminal coupled to a first power voltage, an input terminal, and an output terminal outputting a corresponding driving pulse. A second shift register comprises a first clock input terminal receiving the second clock, a second clock input terminal receiving the first clock, and an input terminal coupled to the output terminal of the first shift register. The first and the second shift registers each comprise a leakage protection unit electrically separating the first power voltage from the received clock at the first clock input terminal when receiving the start pulse or the corresponding driving pulse.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

This description is made for the purpose of illustrating the general principles of the invention and should not be taken in a limiting sense.

Figure 1:
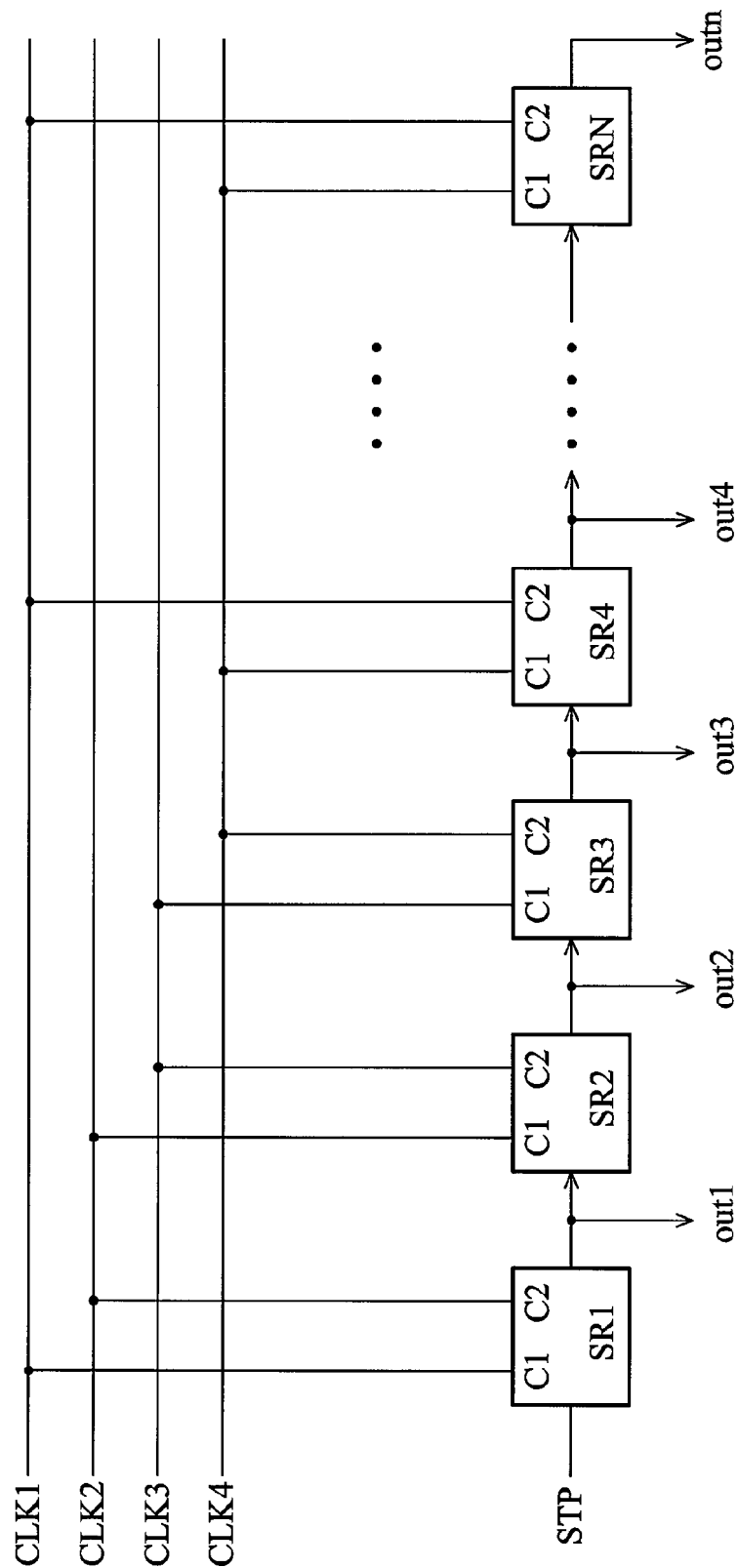
FIG. 1 shows a conventional signal driving circuit comprising PMOS shift registers.
Figure 2:
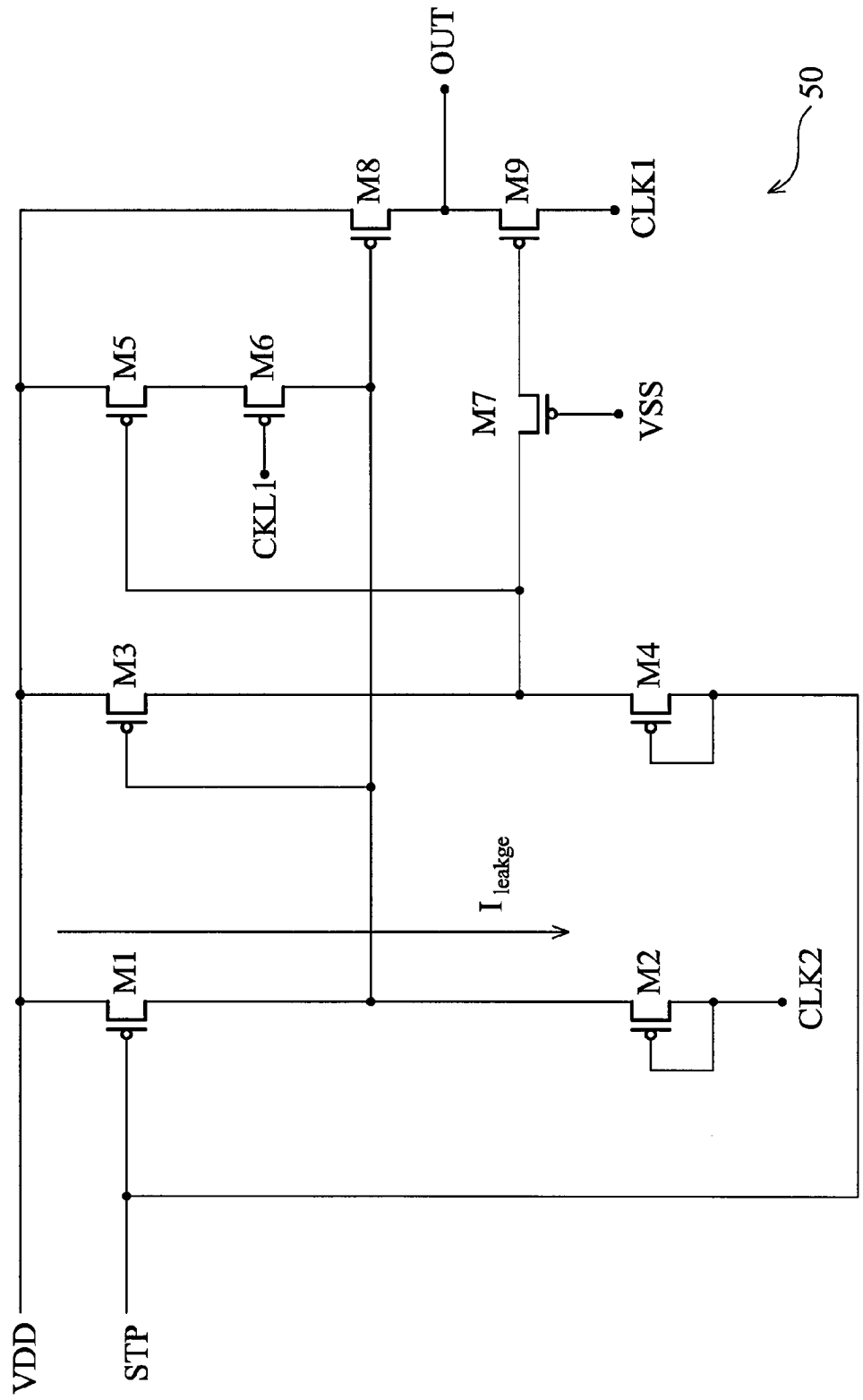
FIG. 2 is a diagram illustrating a shift register providing driving pulses.

In this regard, FIG. 2 depicts a shift register for providing driving pulses.

In this regard, the shift register 50 comprises transistors M1~M9 and is controlled by clocks CLK1 and CLK2. When the start pulse STP goes low, the transistors M1 and M2 are turned on if the clock CLK2 goes low, inducing a leakage $I_{leakage}$ through the transistors M1 and M2, such that the shift register cannot work normally and power consumption is increased.

Figure 3:
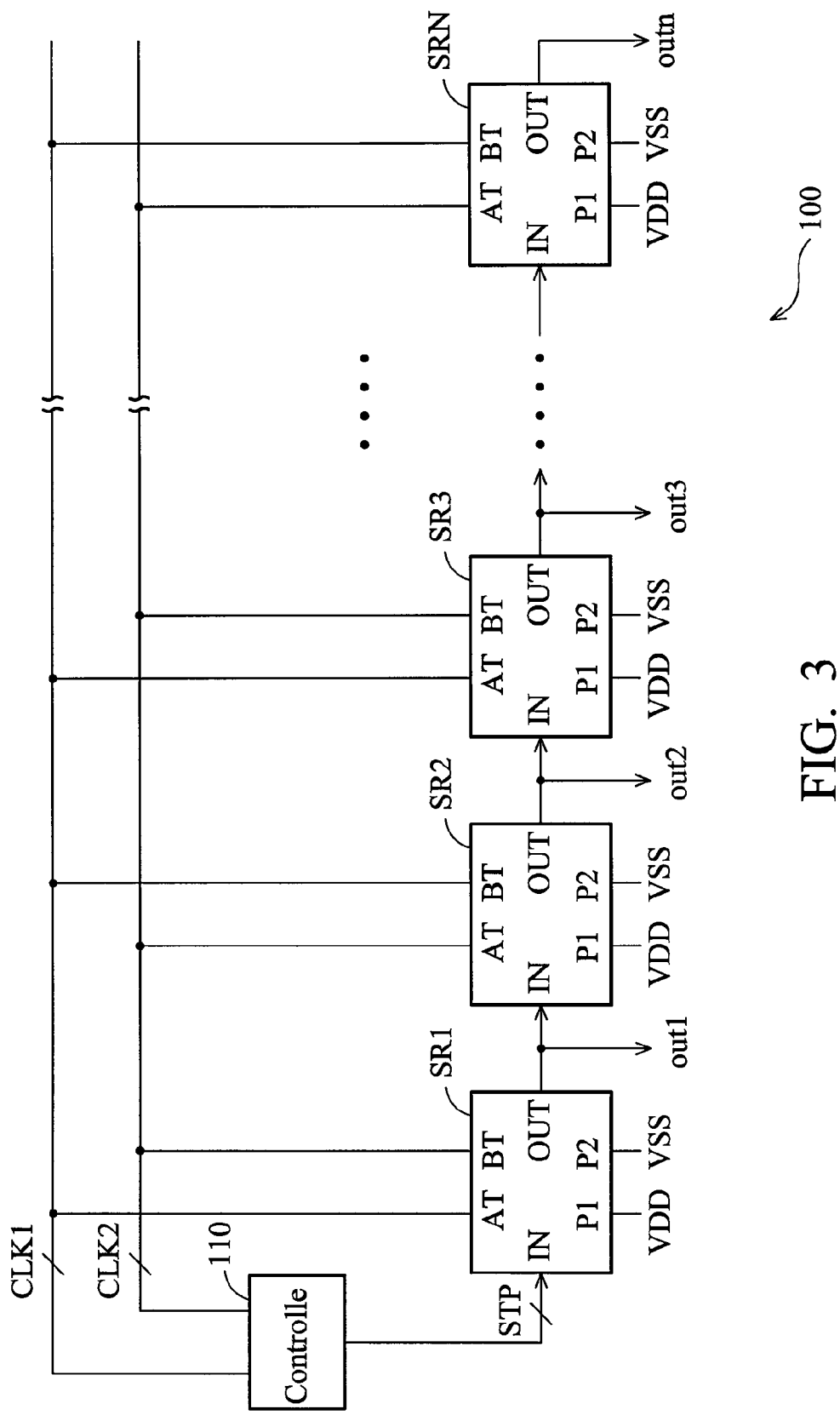
FIG. 3 shows an embodiment of a system displaying images incorporating a signal driving circuit.

FIG. 3 shows an embodiment of a system for displaying images that includes a signals driving circuit. As shown, signal driving circuit 100 comprises a plurality of shift registers SR1~SRN connected in series and each comprising an input terminal IN, an output terminal OUT, two clock input terminals AT and BT, and two power terminals P1 and P2. The shift registers SR1~SRN are controlled by only two clocks CLK1 and CLK2 to output corresponding driving pulses out1~outn, in turn, after receiving a start pulse STP. It is to be noted that the clocks CLK1 and CLK2 are not inverse to each other, but have a phase difference therebetween.

In this embodiment, the signal driving circuit 100 is integrated into a display panel (not shown). A controller 110 provides the clocks CLK1 and CLK2 and the start pulse STP. The controller 110 may be a part of, or the clocks and the start pulse STP may be provided by, timing controller 420 found in an electronic device (see FIG. 8), for example. The controller 110 can, for example, be an application specific integrated circuit (ASIC).

In shift register SR1, the clock input terminal AT is coupled to the first clock CLK1, the clock input terminal BT is coupled to the second clock CLK2, the power terminal P1 is coupled to a power voltage VDD, the power terminal BT is coupled to a power voltage VSS, and the input terminal IN is coupled to the start pulse STP, such that the output terminal OUT is operative to output a corresponding driving pulse out1. In shift register SR2, the clock input terminal AT is coupled to the clock CLK2, the clock input terminal BT is coupled to the clock CLK1, the power terminal P1 is coupled to a power voltage VDD, the power terminal BT is coupled to a power voltage VSS, and the input terminal IN is coupled to the output terminal OUT of the shift register SR1, such that the output terminal OUT is operative to output a corresponding driving pulse out2.

In shift register SR3, the clock input terminal AT is coupled to the clock CLK1, the clock input terminal BT is coupled to the clock CLK2, the power terminal P1 is coupled to a power voltage VDD, the power terminal BT is coupled to a power voltage VSS, and the input terminal IN is coupled to the output terminal OUT of the shift register SR2, such that the output terminal OUT is operative to output a corresponding driving pulse out3, and so on.

Figure 4:
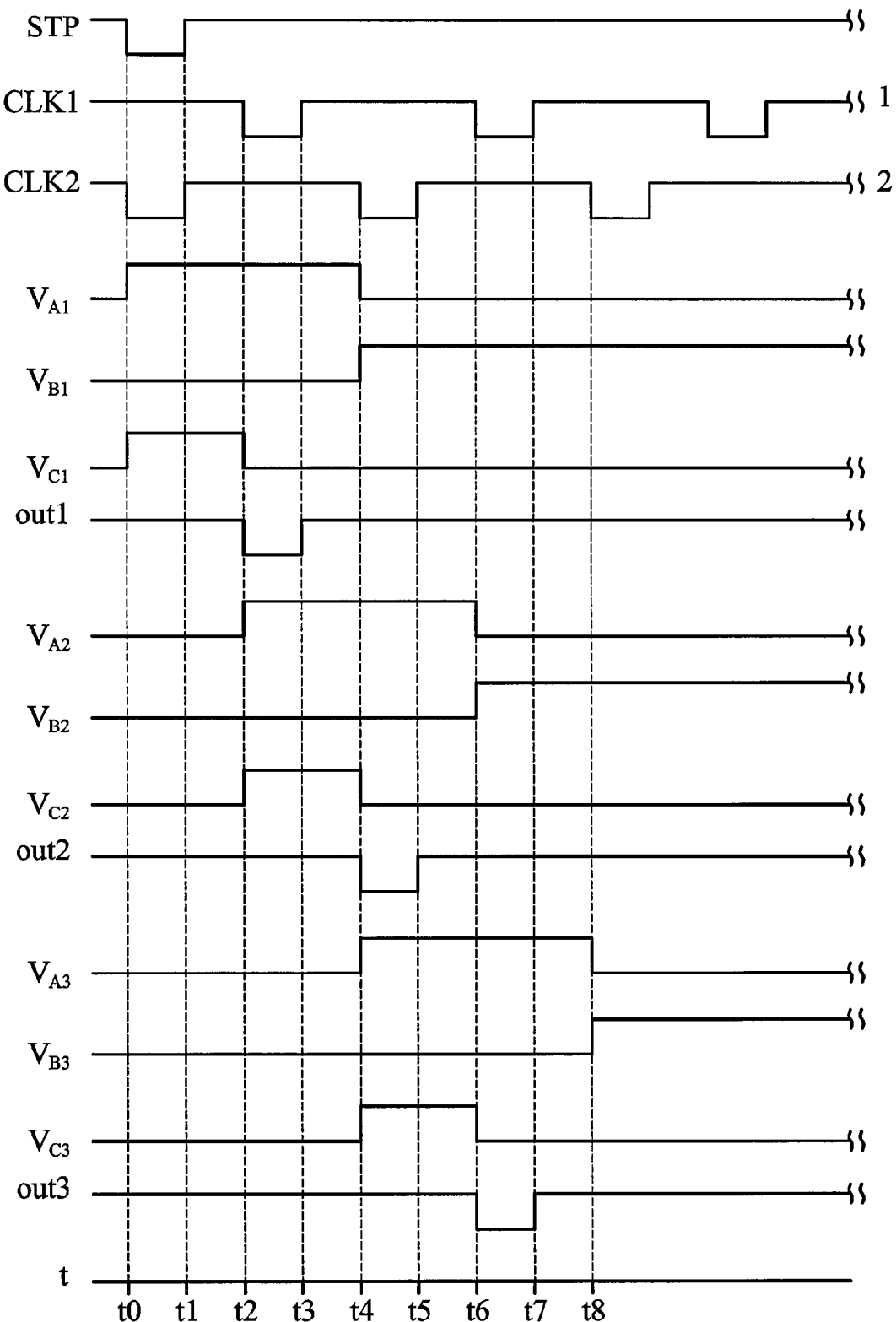
FIG. 4 is a timing chart of the signal driving circuit shown in FIG. 3.

FIG. 4 is a timing chart of the signal driving circuit of FIG. 3. In this regard, the shift register SR1 generates the driving pulse out1 for output to the input terminal IN of the shift register SR2 according to the clock CLK1 after receiving the start pulse STP. For example, after receiving the start pulse STP at time t0, the shift register SR1 outputs driving pulse out1 when the clock CLK1 goes low at time t2.

The shift register SR2 generates the driving pulse out2 for output to the input terminal IN of the shift register SR3 according to the clock CLK2 after receiving the driving pulse out1 from the shift register SR1. For example, after receiving the driving pulse out1 at time t2, the shift register SR2 outputs driving pulse out2 when the clock CLK2 goes low at time t4.

The shift register SR3 generates the driving pulse out3 for output to the input terminal IN of the shift register SR4 (not shown) according to the clock CLK1 after receiving the driving pulse out2 from the shift register SR2. For example, after receiving the driving pulse out2 at time t4, the shift register SR3 outputs driving pulse out3 when the clock CLK1 goes low at time t6, and so on. Namely, the shift registers SR1~SRN are controlled by the clocks CLK1 and CLK2 and output corresponding driving pulses out1~outn to drive scan lines of a pixel array (not shown) after receiving the start pulse STP.

Here, the shift registers SR1~SRN have the same structure, and are formed by MOS transistors with the same conductivity.

Figure 5:
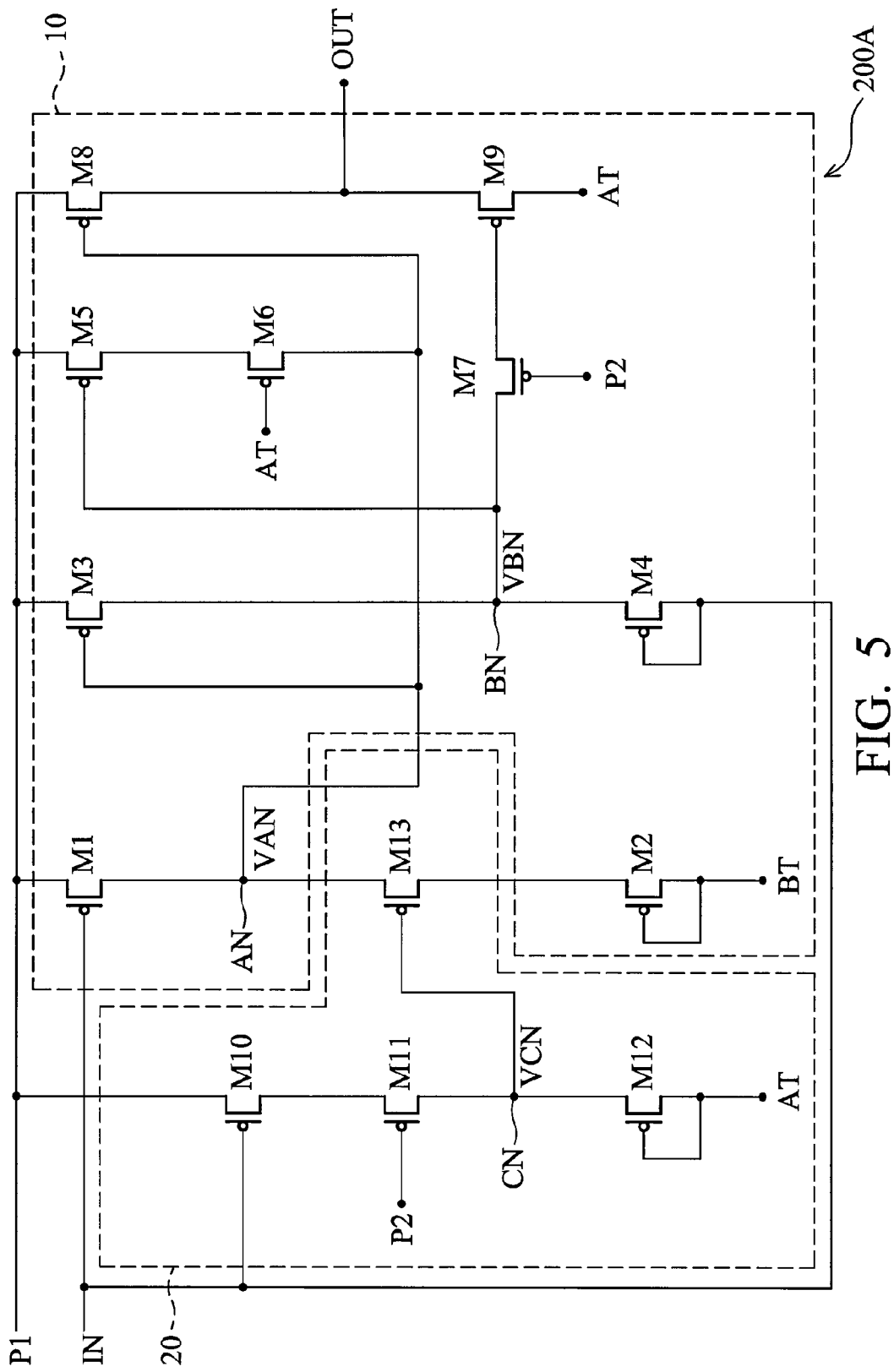
FIG. 5 shows an embodiment of a shift register in the signal driving circuit of the invention.

FIG. 5 shows a first embodiment of the shift register shown in the FIG. 3. The shift register 200A comprises a pulse generation unit 10 and a leakage protection unit 20.

In the pulse generation unit 10, a clock input terminal AT receives one of clocks CLK1 and CLK2, a clock input terminal BT receives the other, a power terminal P1 is coupled to the power voltage VDD, a power terminal P2 is coupled to the power voltage VSS, an output terminal OUT is coupled to the next stage, and an input terminal IN receives a start pulse STP (or corresponding driving pulse from a previous stage).

Leakage protection unit 20 is coupled to the pulse generation unit 10, electrically separating the power voltage VDD from the received clock at the clock input terminal BT when receiving the start pulse STP. After receiving the start pulse STP, the pulse generation unit 10 generates a corresponding driving pulse according to the received clock at the clock input terminal AT.

Further, the leakage protection unit 20 is disabled according to the other of the first and second clocks CLK1 and CLK2 received by the clock input terminal AT after the start pulse STP, and the pulse generation unit 10 is reset according to the received clock at the clock input terminal BT when the leakage protection unit 20 is disabled.

For example, in odd-numbered shift registers, the clock input terminal AT receives the clock CLK1, the clock input terminal BT receives the clock CLK2, and the leakage protection unit 20 electrically separates the power voltage VDD from the clock CLK2 at the clock input terminal BT when receiving the start pulse STP (or corresponding driving pulse from a previous stage). The leakage protection unit 20 is disabled according to the clock CLK1 after the start pulse STP (or corresponding driving pulse from a previous stage), and the pulse generation unit 10 is reset according to the clock CLK2 at the clock input terminal BT when the leakage protection unit 20 is disabled.

Alternately, even-numbered shift registers, the clock input terminal AT receives the clock CLK2, the clock input terminal BT receives the clock CLK1, and the leakage protection unit 20 electrically separates the power voltage VDD from the clock CLK1 at the clock input terminal BT when receiving the start pulse STP (or corresponding driving pulse from a previous stage). Leakage protection unit 20 is disabled according to the clock CLK2 after the start pulse STP (or corresponding driving pulse from a previous stage), and the pulse generation unit 10 is reset according to the clock CLK1 at the clock input terminal BT after the leakage protection unit 20 is disabled.

Pulse generation unit 10 comprises PMOS transistors M1~M9. The transistor M1 comprises a first terminal coupled to the power terminal P1, a control terminal coupled to the input terminal IN, and a second terminal coupled to a node AN. The transistor M2 is coupled to the node AN by the leakage protection unit 20, and a control terminal and a second terminal both coupled to the clock input terminal BT. The transistor M3 comprises a first terminal coupled to the power terminal VDD, a control terminal coupled to the node AN, and a second terminal coupled to a node BN. The transistor M4 comprises a first terminal coupled to the node BN, and a control terminal and a second terminal both coupled to the input terminal IN.

The transistor M5 comprises a first terminal coupled to first power terminal VDD, a control terminal coupled to the node BN, and a second terminal coupled to the transistor M6. The transistor M6 comprises a first terminal coupled to the second terminal of the transistor M5, a control terminal coupled to the clock input terminal AT, and a second terminal coupled to the node BN. The transistor M7 comprises a first terminal coupled to the node BN, a control terminal coupled to the power terminal P2, and a second terminal coupled to the transistor M9. The transistor M8 comprises a first terminal coupled to the power terminal P1, a control terminal coupled to the node AN, and a second terminal coupled to the output terminal OUT. The transistor M9 comprises a first terminal coupled to the output terminal OUT, a control terminal coupled to the second terminal of the transistor M7, and a second terminal coupled to the clock input terminal AT.

The leakage protection unit 20 comprises PMOS transistors M10~M13. The transistor M10 comprises a first terminal coupled to the power terminal VDD, a control terminal coupled to the input terminal IN, and a second terminal coupled to the transistor M11. The transistor M11 comprises a first terminal coupled to the second terminal of the transistor M10, a second terminal coupled to a node CN, and a control terminal coupled to the power terminal P2. The transistor M12 comprises a first terminal coupled to the node CN, a second terminal and a control terminal both coupled to the clock input terminal AT. The transistor M13 is coupled between the node AN and the first terminal of the transistor M2 and comprises a control terminal coupled to the node CN.

It should be noted that the clock input terminals AT and BT in the odd-numbered shift registers, such as SR1, SR3, . . . , are coupled to the clocks CLK1 and CLK2 respectively, and the clock input terminals AT and BT in the odd-numbered shift registers, such as SR2, SR4, . . . , are coupled to the clocks CLK2 and CLK1 respectively. The input terminals IN of the all shift registers SR1~SRN are coupled to the start pulse STP (or corresponding driving pulse from a previous stage), the power terminals P1 of which are coupled to the power voltage VDD, and the power terminals P2 of which are coupled to the power voltage VSS.

Further, the voltages VAN, VBN and VCN at the nodes AN, BN and CN in the shift register SR1 are represented by VA1, VB1 and VC1 respectively (see FIG. 4), and the voltages VAN, VBN and VCN at the nodes AN, BN and CN in the shift register SR2 are represented by VA2, VB2 and VC2 respectively. The voltages VAN, VBN and VCN at the nodes AN, BN and CN in the shift register SR3 are represented by VA3, VB3 and VC3 respectively, and so on.

Operation of the signal driving circuit 100 shown in FIG. 3 is described as follows with reference to FIGS. 4 and 5.

At time t0:

In the shift register SR1, the transistors M1, M2, M4, M5, M7, M9, M10 and M11 are turned on, and the transistors M3, M6, M8, M12 and M13 are turned off as the start pulse STP and the clock CLK2 go low and the clock CLK1 stays high.

As the transistors M1 and M4 are turned on, the voltage VA1 at the node A1 and the voltage VB1 at the node B1 are pulled high and low respectively. Thus, pulse generation unit 10 is enabled and the clock CLK1 is output to serve as a driving pulse out1 because of the transistors M7 and M9. Further, the voltage VC1 is pulled high as the transistors M10 and M11 are turned on, such that the transistor M13 is turned off. Namely, the clock CLK2 (with low level) received by the clock input terminal BT is electrically separated from the power voltage VDD because of the leakage protection unit 20, and thus, leakage is prevented.

The shift registers SR2~SRN are disabled as no corresponding start pulse is input to the shift registers SR2~SRN at this time.

At time t1:

In shift register SR1, the transistors M5, M7, M9 and M11 are turned on, and the transistors M1, M2, M3, M4, M6, M8, M10, M12 and M13 are turned off as the start pulse STP and the clock CLK2 go high and the clock CLK1 stays high. Thus, the voltages VA1 and VC1 at the node A1 and C1 stay high and the voltage VB1 at the node B1 stays low. The driving pulse out1 still stays high because the clock CLK1 stays high.

The shift registers SR2~SRN are disabled as no corresponding start pulse is input to the shift resisters SR2~SRN at this time.

At time t2:

In shift register SR1, the transistors M5, M6, M7, M9, M11, M12 and M13 are turned on, and the transistors M1, M2, M3, M4, M8 and M10 are turned off because the start pulse STP and the clock CLK2 stay high and the clock CLK1 goes low. Thus, the voltages VA1 and VB1 at the nodes A1 and B1 stay high and low respectively, and the voltage VC1 at the node C1 goes low. As the voltage VC1 goes low, the transistor M13 is turned on. Namely, leakage protection unit 20 is disabled because of the clock CLK1. Further, the driving pulse out1 of the shift register SR1 goes low as the clock CLK1 goes low at this time.

Concurrently, pulse generation unit 10 in the shift register SR2 is enabled, and the voltage VA2 at the node A2 and the voltage VB2 at the node B2 in the shift register SR2 are pulled high and low respectively. Thus, in the shift register SR2, the clock CLK2 is output to serve as a driving pulse out2 because of the transistors M7 and M9. Further, the voltage VC2 is pulled high as the transistors M10 and M11 are turned on, such that transistor M13 is turned off. Namely, the clock CLK1 (at low level) received by the clock input terminal BT is electrically separated from the power voltage VDD because of the leakage protection unit 20, and thus, leakage can be prevented.

The shift registers SR3~SRN are still disabled as no corresponding start pulse is input to the shift resisters SR3~SRN at this time.

At time t3:

In the shift register SR1, the transistors M5, M7, M9, M11 and M13 are turned on, and the transistors M1, M2, M3, M4, M6, M8, M10 and M12 are turned off as the start pulse STP and the clock CLK2 stay high and the clock CLK1 goes high. Thus, the voltage VA1 at the node A1 stays high, the voltages VB1 and VC1 at the nodes B1 and C1 stay low. The driving pulse out1 of the shift register SR1 goes high as the clock CLK1 goes high at this time.

Concurrently, in shift register SR2, the transistors M5, M7, M9 and M11 are turned on, and the transistors M1, M2, M3, M4, M6, M8, M10, M12 and M13 are turned off because the driving pulse out1 (corresponding start pulse) and the clock CLK1 go high and the clock CLK2 stays high. Thus, the voltages VA2 and VC2 at the node A1 and C1 stay high and the voltage VB2 at the node B1 stays low. The driving pulse out2 still stays high because the clock CLK2 stays high.

The shift registers SR3~SRN are still disabled as no corresponding start pulse is input to the shift resisters SR3~SRN at this time.

At time t4:

In the shift register SR1, the transistors M2, M3, M7, M8, M11 and M13 are turned on, and the transistors M1, M4, M5, M6, M9, M10 and M12 are turned off because the start pulse STP and the clock CLK1 stay high and the clock CLK2 goes low. As the transistors M2~M3 and M13 are turned on, the voltage VA1 at the node A1 and the voltage VB1 at the node B1 are pulled low and high respectively, and thus, pulse generation unit 10 is reset.

Concurrently, in shift register SR2, the transistors M5, M6, M7, M9, M11, M12 and M13 are turned on, and the transistors M1, M2, M3, M4, M8 and M10 are turned off as the driving pulse out1 (corresponding start pulse) and the clock CLK1 stay high and the clock CLK2 goes low. Thus, the voltages VA2 and VB2 at the nodes A2 and B2 stay high and low respectively, and the voltage VC2 at the node C2 goes low. As the voltage VC2 goes low, the transistor M13 is turned on. Namely, leakage protection unit 20 is disabled because of the clock CLK2. Further, the driving pulse out2 of the shift register SR2 goes low as the clock CLK2 goes low at this time Concurrently, pulse generation unit 10 in the shift register SR3 is enabled, and the voltage VA3 at the node A3 and the voltage VB3 at the node B3 in the shift register SR3 are pulled high and low respectively. Thus, in the shift register SR3, the clock CLK1 is output to serve as a driving pulse out3 because of the transistors M7 and M9. Further, the voltage VC3 is pulled high because the transistors M10 and M11 are turned on, such that the transistor M13 is turned off. Namely, the clock CLK2 (with low level) received by the clock input terminal BT is electrically separated from the power voltage VDD because of the leakage protection unit 20, and thus, leakage is prevented.

The shift registers SR4~SRN are still disabled as no corresponding start pulse is input to the shift resisters SR4~SRN at this time.

At time t5:

In the shift register SR1, the driving pulse out1 stays high because the pulse generation unit 10 is reset.

Concurrently, in the shift register SR2, the transistors M5, M7, M9, M11 and M13 are turned on, and the transistors M1, M2, M3, M4, M6, M8, M10 and M12 are turned off because the driving pulse out1 and the clock CLK1 stay high and the clock CLK2 goes high. Thus, the voltage VA2 at the node A2 stays high, the voltages VB2 and VC2 at the nodes B2 and C2 stay low. The driving pulse out2 of the shift register SR2 goes high because the clock CLK2 goes high at this time.

Concurrently, in shift register SR3, the transistors M5, M7, M9 and M11 are turned on, and the transistors M1, M2, M3, M4, M6, M8, M10, M12 and M13 are turned off because the driving pulse out2 (corresponding start pulse) and the clock CLK2 go high and the clock CLK1 stays high. Thus, the voltages VA3 and VC3 at the node A3 and C3 stay high and the voltage VB3 at the node B3 stays low. The driving pulse out3 still stays high because the clock CLK1 stays high.

The shift registers SR4~SRN are still disabled as no corresponding start pulse is input to the shift resisters SR4~SRN at this time At time t6:

In the shift register SR1, the driving pulse out1 stays high because the pulse generation unit 10 is reset.

Concurrently, in the shift register SR2, the transistors M2, M3, M7, M8, M11 and M13 are turned on, and the transistors M1, M4, M5, M6, M9, M10 and M12 are turned off because the driving pulse out1 and the clock CLK2 stay high and the clock CLK1 goes low. As the transistors M2, M3 and M13 are turned on, the voltage VA2 at the node A2 and the voltage VB2 at the node B2 are pulled low and high respectively, and thus, the pulse generation unit 10 is reset.

Concurrently, in shift register SR3, the transistors M5, M6, M7, M9, M11, M12 and M13 are turned on, and the transistors M1, M2, M3, M4, M8 and M10 are turned off because the driving pulse out2 (corresponding start pulse) and the clock CLK2 stay high and the clock CLK1 goes low. Thus, the voltages VA3 and VB3 at the nodes A3 and B3 stay high and low respectively, and the voltage VC3 at the node C3 goes low. As the voltage VC3 goes low, the transistor M13 is turned on. Namely, the leakage protection unit 20 is disabled because of the clock CLK2. Further, the driving pulse out3 of the shift register SR3 goes low as the clock CLK1 goes low at this time Concurrently, the pulse generation unit 10 in the shift register SR4 is enabled, and the voltage VA4 at the node A4 and the voltage VB4 at the node B4 in the shift register SR4 are pulled high and low respectively. Thus, in the shift register SR4, the clock CLK2 is output to serve as a driving pulse out4 because of the transistors M7 and M9. Further, the voltage VC4 is pulled high because the transistors M10 and M11 are turned on, such that the transistor M13 is turned off. Namely, the clock CLK1 (with low level) received by the clock input terminal BT is electrically separated from the power voltage VDD because of the leakage protection unit 20, and thus, leakage is prevented.

The shift registers SR5~SRN are still disabled as no corresponding start pulse is input to the shift resisters SR5~SRN at this time.

At time t7:

In the shift registers SR1 and SR2, the driving pulses out1 and out2 both stay high because the pulse generation units 10 are reset.

In shift register SR3, transistors M5, M7, M9, M11 and M13 are turned on, and transistors M1, M2, M3, M4, M6, M8, M10 and M12 are turned off because the driving pulse out2 and the clock CLK2 stay high and the clock CLK1 goes high.

Thus, the voltage VA3 at the node A3 stays high, the voltages VB3 and VC3 at the nodes B3 and C3 stay low. The driving pulse out3 of the shift register SR3 goes high because the clock CLK1 goes high at this time.

Concurrently, in shift register SR4, the transistors M5, M7, M9 and M11 are turned on, and the transistors M1, M2, M3, M4, M6, M8, M10, M12 and M13 are turned off because the driving pulse out3 (corresponding start pulse) and the clock CLK1 go high and the clock CLK2 stays high. Thus, the voltages VA4 and VC4 at the node A4 and C4 stay high and the voltage VB4 at the node B4 stays low. The driving pulse out4 still stays high because the clock CLK4 stays high.

The shift registers SR5~SRN are still disabled as no corresponding start pulse is input to the shift resisters SR5~SRN at this time At time t8:

In the shift registers SR1 and SR2, the driving pulses out1 and out2 both stay high because the pulse generation units 10 are reset.

In the shift register SR3, the transistors M2, M3, M7, M8, M11 and M13 are turned on, and the transistors M1, M4, M5, M6, M9, M10 and M12 are turned off because the driving pulse out2 and the clock CLK1 stay high and the clock CLK2 goes low. As the transistors M2, M3 and M13 are turned on, the voltage VA3 at the node A3 and the voltage VB3 at the node B3 are pulled low and high respectively, and thus, the pulse generation unit 10 is reset.

Concurrently, in shift register SR4, the transistors M5, M6, M7, M9, M11, M12 and M13 are turned on, and the transistors M1, M2, M3, M4, M8 and M10 are turned off because the driving pulse out3 (corresponding start pulse) and the clock CLK1 stay high and the clock CLK2 goes low. Thus, the voltages VA4 and VB4 at the nodes A4 and B4 stay high and low respectively, and the voltage VC4 at the node C4 goes low. As the voltage VC4 goes low, the transistor M13 is turned on. Namely, the leakage protection unit 20 is disabled because of the clock CLK2. Further, the driving pulse out4 of the shift register SR4 goes low because the clock CLK2 goes low at this time.

The sequential operations of the shift registers SR4~SRN are similar to that of the shift registers SR1~SR3, and thus, are omitted for simplification.

Thus, the signal driving circuit 100 outputs clocks CLK1 or CLK2 in turn to serve as corresponding driving pulses. Because the signal driving circuit of this embodiment requires only two clocks and is formed by PMOS shift registers, it can be less expensive to manufacture than a conventional signal driving circuit with CMOS shift registers and those requiring four clock signals. Further, because PMOS shift registers in the signal driving circuit each comprise a leakage unit to electrically separate power voltages from the clocks during operations, undesired leakage is prevented.

Figure 6:
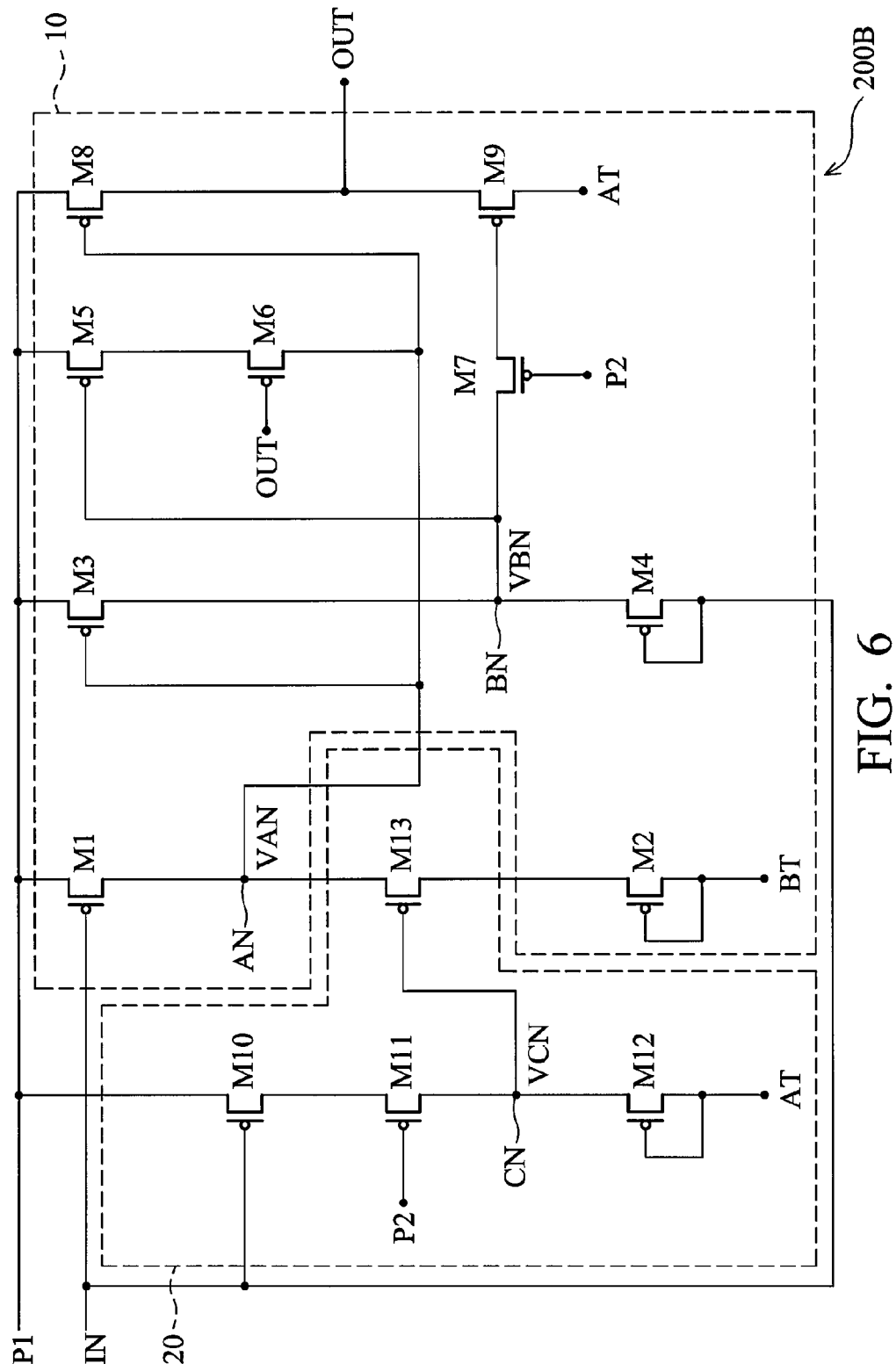
FIG. 6 shows another embodiment of a shift register of the invention.

FIG. 6 shows another embodiment of a shift register. As shown, the shift register 200B is similar to the shift register 200A shown in FIG. 5 except that the control terminal of the transistor M6 is coupled to the output terminal OUT rather than the clock input terminal AT. The operation of the shift register 200B is similar to that of the shift register 200A, and thus, is omitted for simplification.

Figure 7:
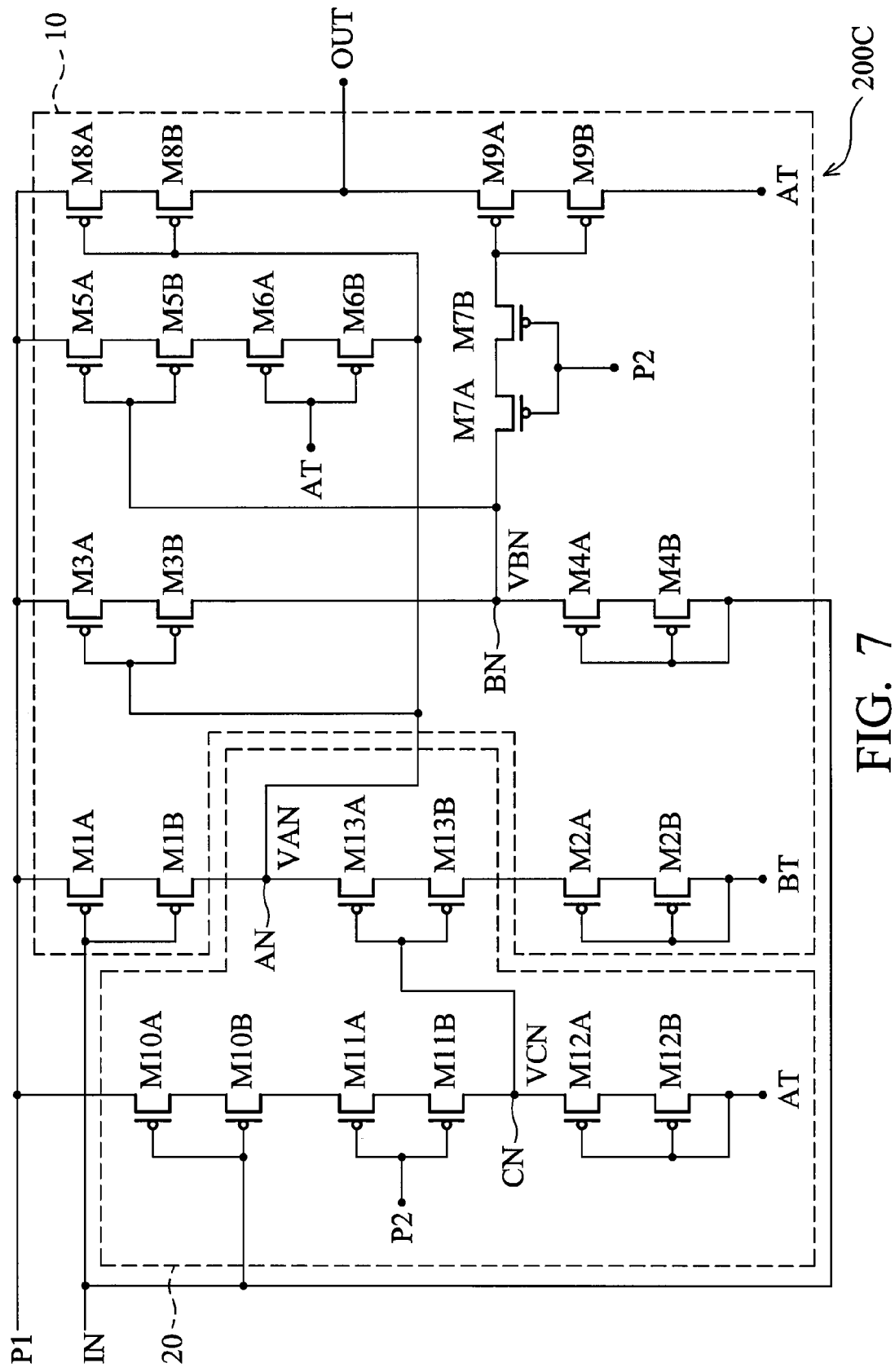
FIG. 7 shows still another embodiment of a shift register of the invention.

FIG. 7 shows still another embodiment of a shift register. As shown, the shift register 200C is similar to the shift register 200A shown in FIG. 5 except that PMOS transistors M1~M13 are replaced by dual gate transistors M1A~M13B to increase reliability thereof. For example, the PMOS transistor M1 is replaced by a dual gate transistor composed of two PMOS transistors M1A and M1B, the PMOS transistor M2 is replaced by a dual gate transistor composed of two PMOS transistors M2A and M2B, the PMOS transistor M3 is replaced by a dual gate transistor composed of two PMOS transistors M3A and M3B, and so on. The operation of the shift register 200C is similar to that of the shift register 200A, and thus, is omitted for simplification.

Figure 8:
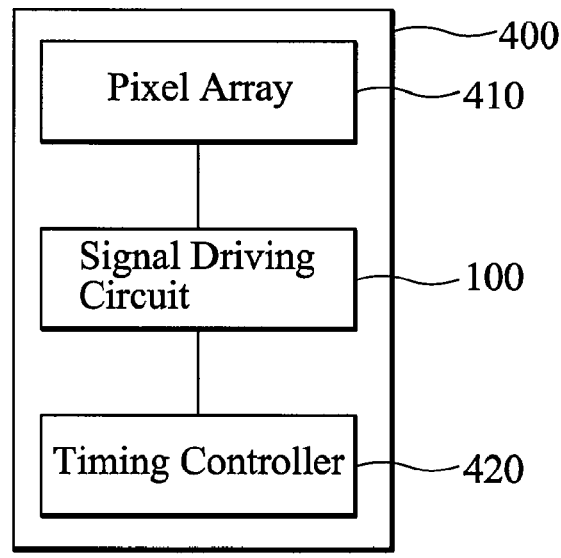
FIG. 8 shows an embodiment of a system for displaying images.

As shown in FIG. 8, another embodiment of a system for displaying images is depicted that is implemented as a display panel. As shown in FIG. 8, display panel 400 comprises a signal driving circuit such as the described signal driving circuit 100, a pixel array 410 and a timing controller 420. In the display panel 400, the pixel array 410 is operatively coupled to the signal driving circuit 100. The signal driving circuit outputs a plurality of driving pulses in turn to drive display array 410. The timing controller 420 provides clock signals and a start pulse to the signal driving circuit 100.

Figure 9:
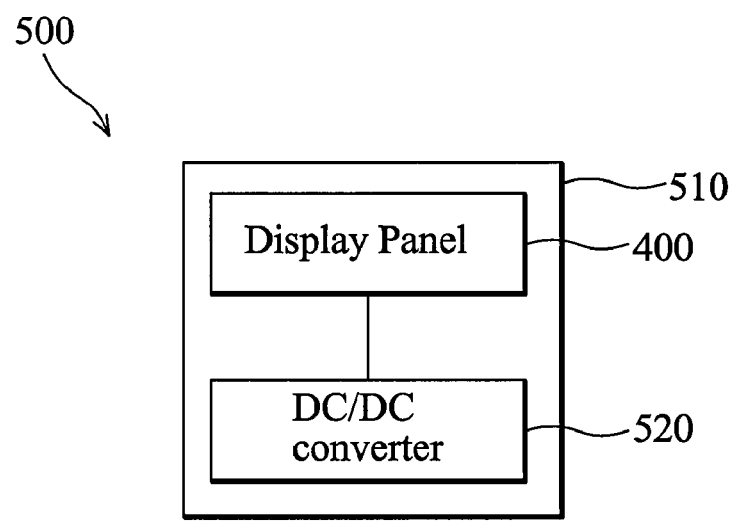
FIG. 9 shows another embodiment of a system for displaying images.

FIG. 9 schematically shows another embodiment of a system for displaying images, implemented here as an electronic device 500, comprising a display panel, such as display panel 400, which can be a plasma display panel, an organic light emitting display panel, or a cathode ray tube display panel in other embodiments, but is not limited thereto. The electronic device 500 may be a digital camera, a portable DVD, a television, a car display, a PDA, notebook computer, tablet computer, cellular phone, or a display device, etc. Generally, the electronic device 500 includes a housing 510, the display panel 400 and a DC/DC converter 520. The DC/DC converter 520 is operatively coupled to the display panel 400 and provides an output voltage powering the display panel 400 to display images.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A system for displaying images, comprising:
   a signal driving circuit comprising:
      a plurality of shift registers connected in series and controlled only by a first clock and a second clock, and operative to generate corresponding driving pulses in turn in response to a start pulse, wherein each of the shift registers comprises:
         a pulse generation unit with a first clock input terminal and operative to receive one of the first and the second clocks and a first power terminal coupled to a first power voltage; and
         a leakage protection unit coupled to the pulse generation unit, electrically separating the first power voltage from a clock signal received from the first clock and the second clock at first clock input terminal, wherein the leakage protection unit comprises:
            a first switching element comprising a first coupled to the first power terminal, a control terminal coupled to the start pulse, and a second terminal;
            a second switching element comprising a first terminal coupled to the second terminal of the switching element, and a second terminal coupled to a first node;
            a third switching element comprising a first terminal coupled to the first node, and a control terminal and a second terminal both coupled to the second clock input terminal; and
            a fourth switching element coupled between the first rower voltage on the first rower terminal and the received clock by the first clock input terminal in the pulse generation unit, and comprising a control terminal coupled to the first node.

2. The system as claimed in claim 1, wherein the leakage protection unit electrically separates the first power voltage from the received clock signal in response to the start pulse.

3. The system as claimed in claim 1, wherein the shift registers are formed by MOS transistors of a same conductivity type.

4. The system as claimed in claim 1, wherein an output terminal of an $N^{th}$ of the shift registers is coupled to an input terminal of an $N+1^{th}$ of the shift registers and a corresponding driving pulse output from the $N^{th}$ of the shift registers serves as a start pulse of the $N+1^{th}$ of the shift registers.

5. The system as claimed in claim 2, wherein the pulse generation unit further comprises a second clock input terminal operative to receive the other of the clock signals of the first and the second clocks and generate a corresponding driving pulse according thereto.

6. The system as claimed in claim 5, wherein the leakage protection unit is disabled according to the other of the signals of the first and the second clocks.

7. The system as claimed in claim 6, wherein the pulse generation unit is reset according to the received clock at first clock input terminal after the leakage protection unit is disabled.

8. The system as claimed in claim 7, wherein the first and the second clock input terminals of the $N^{th}$ of the shift register are coupled to the first and the second clocks respectively, and the first and the second clock input terminals of the $N+1^{th}$ of the shift register are coupled to the second and the first clocks respectively.

9. The system as claimed in claim 1, wherein the pulse generation unit further comprising:
   a fifth switching element coupled between the first power terminal and a first terminal of the fourth switching element, and comprising a control terminal coupled to the start pulse;
   a sixth switching element coupled between a second terminal of the fourth switching element and the first clock input terminal, and comprising a control terminal coupled to the first clock input terminal;
   a seventh switching element comprising a first terminal coupled to the first power terminal, a control terminal coupled to the first terminal of the fourth switching element, and a second terminal;
   an eighth switching element comprising a first terminal coupled to the second terminal of the seventh switching element, and a control terminal and a second terminal both coupled to the start pulse;
   a ninth switching element comprising a first terminal coupled to the first power terminal, a control terminal coupled to the first terminal of the eighth switching element, and a second terminal;
   a tenth switching element coupled between the second terminals of the fifth and the ninth switching elements, and comprising a control terminal coupled to the output terminal;
   an eleventh switching element comprising a first terminal coupled to the first terminal of the eighth switching element, a control terminal coupled to a second power terminal, and a second terminal;
   a twelfth switching element coupled between the first power terminal and the output terminal and comprising a control terminal coupled to the second terminal of the tenth switching element; and a thirteenth switching element coupled between the output terminal and the second clock input terminal, and a control terminal coupled to the second terminal of the eleventh switching element.

10. The system as claimed in claim 1, wherein the pulse generation unit further comprising:
a fifth switching element coupled between the first power terminal and a first terminal of the fourth switching element, and comprising a control terminal coupled to the start pulse;
a sixth switching element coupled between a second terminal of the fourth switching element and the first clock input terminal, and comprising a control terminal coupled to the first clock input terminal;
a seventh switching element comprising a first terminal coupled to the first power terminal, a control terminal coupled to the first terminal of the fourth switching element, and a second terminal;
an eighth switching element comprising a first terminal coupled to the second terminal of the seventh switching element, and a control terminal and a second terminal both coupled to the start pulse;
a ninth switching element comprising a first terminal coupled to the first power terminal, a control terminal coupled to the first terminal of the eighth switching element, and a second terminal;
a tenth switching element coupled between the second terminals of the fifth and the ninth switching elements, and comprising a control terminal coupled to the second clock input terminal;
an eleventh switching element comprising a first terminal coupled to the first terminal of the eighth switching element, a control terminal coupled to the second power terminal, and a second terminal;
a twelfth switching element coupled between the first power terminal and the output terminal and comprising a control terminal coupled to the second terminal of the tenth switching element; and
a thirteenth switching element coupled between the output terminal and the second clock input terminal, and a control terminal coupled to the second terminal of the eleventh switching element.

11. The system as claimed in claim 10, wherein the first to the thirteenth switching elements are dual gate MOS transistors.

12. The system as claimed in claim 1, further comprising a display panel, wherein the signal driving circuit forms a portion of the display panel.

13. The system as claimed in claim 12, wherein the display panel is a liquid crystal display panel, an original light emitting display panel, or a plasma display panel.

14. The system as claimed in claim 12, further comprising an electronic device wherein the electronic device comprises:
the display panel; and
means for powering the display panel.

15. The system as claimed in claim 12, further comprising an electronic device, wherein the electronic device comprises:
the display panel; and
a DC/DC converter coupled to the display panel and operative to power the display panel.

16. The system as claimed in claim 15, wherein the electronic device is a digital camera, a portable DVD, a television, a car display, a PDA, a display monitor, a notebook computer, a tablet computer, or a cellular phone.

17. A system for displaying images, comprising:
a signal driving circuit comprising:
a plurality of shift registers connected in series, generating corresponding driving pulses in turn in response to a start pulse, wherein each shift register comprises:
a pulse generation unit powered by a first power voltage and a second power voltage and coupled, with respect to clocks, only to a first clock and a second clock, wherein the pulse generation unit comprises:
a first switching element comprising a first terminal coupled to the first power voltage, and a second terminal; and
a second switching element comprising a control terminal and a first terminal both coupled to the first clock or the second clock; and a second terminal; and
a leakage protection unit coupled to the pulse generation unit, and configured to electrically separate the first and second power voltages from the first clock and alternately from the second clock, wherein the pulse generation unit comprises a third switching element coupled between the second terminal of the first switching element and the second terminal of the second switching element to element according to the start pulse, thereby separating the first power voltage from the first clock or the second clock at the first terminal of the second switching element.

18. A system for displaying images, comprising:
a signal driving circuit controlled by only a first clock and a second clock to generate a plurality of driving pulses in turn according to a start pulse, wherein the signal driving circuit comprises:
a first shift register comprising a first clock input terminal operative to receive a signal from the first clock, a second clock input terminal operative to receive a signal from the second clock, a power terminal coupled to a first power voltage, an input terminal, and an output terminal operative to output a corresponding driving pulse; and
a second shift register comprising a first clock input terminal operative to receive a signal from the second clock, a second clock input terminal operative to receive a signal from the first clock, and an input terminal coupled to the output terminal of the first shift register, in which the first and the second shift registers each comprises:
a pulse generation unit powered by the first power voltage and a second power voltage and coupled, with respect to clocks, only to the first clock and the second clock, wherein the pulse generation unit comprises:
a first switching element comprising a first terminal coupled to the first power terminal, and a second terminal; and
a second switching element comprising a control terminal and a first terminal both coupled to the first clock or the second clock; and a second terminal; and
a leakage protection unit operative to electrically separate the first power voltage from the signal received at the first clock input terminal responsive to receiving either of the start pulse or the corresponding driving pulse, wherein the leakage protection unit comprises a third switching element coupled between the second terminal of the first switching element coupled between the second terminal of the first switching element and the second terminal of the second switching element to electrically disconnect the first and second switching element according to either of the start pulse or the corresponding driving pulse, thereby separating the first power voltage from the first clock or the second clock at the first terminal of the second switching element.

19. The system as claimed in claim 18, wherein the shift registers are formed only by MOS transistors of the same conductivity type.

* * * * *